United States Patent [19]
Aronowitz et al.

[11] Patent Number: 6,033,998
[45] Date of Patent: Mar. 7, 2000

[54] METHOD OF FORMING VARIABLE THICKNESS GATE DIELECTRICS

[75] Inventors: Sheldon Aronowitz; David Chan; James Kimball; David Lee, all of San Jose; John Haywood, Santa Clara; Valeriy Sukharev, Cupertino, all of Calif.

[73] Assignee: LSI Logic Corporation, Milpitas, Calif.

[21] Appl. No.: 09/038,684

[22] Filed: Mar. 9, 1998

[51] Int. Cl.$^7$ .................................................. H01L 21/76
[52] U.S. Cl. ........................ 438/786; 438/787; 438/788; 148/116; 148/163
[58] Field of Search .................................. 438/199, 775, 438/787, 788, 786; 148/116, 163

[56] References Cited

U.S. PATENT DOCUMENTS

| | | | |
|---|---|---|---|
| 4,151,537 | 4/1979 | Goldman et al. | 357/23 |
| 4,257,832 | 3/1981 | Schwabe et al. | 148/187 |
| 4,306,353 | 12/1981 | Jacobs et al. | 29/571 |
| 4,438,157 | 3/1984 | Romano-Moran | 427/93 |
| 4,621,277 | 11/1986 | Ito et al. | 357/54 |
| 4,849,366 | 7/1989 | Hsu et al. | 437/42 |
| 4,869,781 | 9/1989 | Euen et al. | 156/643 |
| 5,258,333 | 11/1993 | Shappir et al. | 437/235 |
| 5,356,722 | 10/1994 | Nguyen et al. | 427/569 |
| 5,397,748 | 3/1995 | Watanabe et al. | 437/239 |
| 5,429,965 | 7/1995 | Shimoji | 437/43 |
| 5,434,109 | 7/1995 | Geissler et al. | 437/239 |
| 5,464,783 | 11/1995 | Kim et al. | 437/42 |
| 5,478,765 | 12/1995 | Kwong et al. | 437/40 |
| 5,571,734 | 11/1996 | Tseng et al. | 437/40 |
| 5,573,974 | 11/1996 | Hwang | 437/69 |
| 5,620,910 | 4/1997 | Teramoto | 438/151 |

OTHER PUBLICATIONS

M. Bhat, et al., "Effects of Chemical Composition on the Electrical Properties of NO–Nitrided $SiO_2$," *Appl. Phys. Lett.*, vol. 66, pp. 1225–1227 (1995).

C.T. Liu, et al, "High Performance 0.2 $\mu$m CMOS with 25 A Gate Oxide Grown on Nitrogen Implanted Si Substrates," *IEDM*, pp. 499–502 (1995).

D.T. Grider, et al., "A 0.18 $\mu$m CMOS Process using Nitrogen Profile–Engineered Gate Dielectrics," *Symp. on VLSI Technology Digest of Tech. Papers*, pp. 47–48 (1997). [Not yet received at libraries.].

S.V. Hattangady, et al., "Ultrathin Nitrogen–Profile Engineered Gate Dielectric Films," *IEDM*, pp. 495–498 (1996).

S.V. Hattangady, et al., "Controlled Nitrogen Incorporation at the Gate Oxide Surface," *Appl. Phys. Lett.*, vol. 66, pp. 3495–3497 (1995).

*Primary Examiner*—Charles Bowers
*Assistant Examiner*—Lisa Kilday
*Attorney, Agent, or Firm*—Beyer & Weaver, LLP

[57] ABSTRACT

Provided is a method of fabricating gate dielectric layers having variable thicknesses and compositions over different regions of a semiconductor wafer. In a preferred embodiment of the present invention, a gate oxide layer is first grown over the various regions. Regions that are to have a relatively thicker, unhardened gate dielectric are masked and the wafer is exposed to a remote low energy nitrogen plasma. After the nitridization process is completed, the mask is removed and the wafer is exposed to further oxidation. The regions where oxynitrides have been formed act as a barrier to the oxidation process. Consequently, different oxide thicknesses can be grown on the same wafer, thinner and hardened where nitridization has been performed, and thicker and not hardened in those regions that were masked during the nitridization. Variable thickness gate dielectrics in accordance with the present invention may be particularly advantageous in semiconductor integrated circuits involving both digital and analog devices.

22 Claims, 2 Drawing Sheets

METHOD OF FORMING VARIABLE THICKNESS GATE DIELECTRICS

CROSS-REFERENCE TO RELATED APPLICATIONS

This application is related to U.S. application Ser. No. 09/037,588 (Attorney Docket No. LSI2P115/P-3422) entitled COMPOSITE SEMICONDUCTOR GATE DIELECTRICS, filed concurrently herewith, and which is incorporated by reference herein for all purposes.

BACKGROUND OF THE INVENTION

This invention relates generally to semiconductor fabrication, and particularly to dielectric and barrier layers used in semiconductor fabrication. More specifically, the invention relates to methods of fabrication of semiconductor gate dielectrics of variable thickness and composition in a single device.

FIGS. 1A through C illustrate steps in a conventional semiconductor fabrication process on a portion of a semiconductor wafer 100. In FIG. 1A, a semiconductor substrate 101 is shown. The substrate 101 has a gate oxide layer 104 formed on its upper surface 102. The gate oxide layer 104 may be created in ways well known to those of skill in the art. For example, the gate oxide may be silicon dioxide ($SiO_2$) generated by thermal oxidation of surface 102 of the silicon substrate 101, or may be deposited on the silicon substrate 101 by chemical vapor deposition (CVD). Typical conventional gate oxide thicknesses, for example for semiconductor devices having gate lengths from about 0.18 to 1 $\mu$m, are about 25 to 200 Å.

As shown in FIGS. 1B and 1C, a polysilicon (poly) layer 106 is typically deposited over the following gate oxide layer 104, for example by CVD. FIG. 1B shows the wafer 100 with the poly layer 106 on the gate oxide layer 104. FIG. 1C shows the wafer 100 after the poly layer 106 has been patterned and etched to form a gate electrode 108, according to methods well known in the art. The gate electrode 108 may then be used as a mask in a self-aligned implant process to produce doped active source 110 and drain 112 regions in the substrate 101, on either side of the gate electrode 108, thereby forming an MOS transistor.

As semiconductor technology develops, semiconductor device geometries have been reduced. As a result, the various components that make up a semiconductor have been decreased in size. For example, MOS transistor gate widths have been reduced below 0.5 $\mu$m to 0.35 $\mu$m, 0.25 $\mu$m and smaller device sizes are currently being developed. As device sizes decrease, gate dielectric layers in such devices should correspondingly become thinner. For example, in some next generation devices the channel length will be about 0.18 $\mu$m and the gate oxide thickness will be about 30 Å. In future generation devices both the channel length and gate oxide thickness will continue to shrink. However, thinner gate dielectrics are more susceptible to failure. Therefore, it is desirable to increase the capability of thin gate dielectrics, commonly oxides, so that they are better able to withstand the high electric fields to which they are subjected in normal operation of smaller semiconductor devices through a process referred to as "hardening".

Gate oxide hardening is required for at least three reasons. First, insufficiently hard gate oxides can break down at voltages below normal operating voltages. Second, hardened gate oxides are resistant to hot electron degradation which creates structural defects, such as dangling bonds, in gate oxides. Finally, hardened gate oxides may also be effective in preventing diffusion of dopant atoms from the gate electrode through the gate oxide into the substrate. One particularly troubling problem is boron diffusion from a polysilicon gate electrode, through the gate oxide and into the silicon substrate. Boron is mobile at typical processing temperatures. Unwanted dopant diffusion into the substrate will cause fluctuations in the semiconductor device's threshold voltage. This is particularly important in PMOS devices where boron dopant is commonly used in the polysilicon gate electrode.

Conventional methods for hardening gate oxides have involved diffusing nitrogen into a gate oxide after its formation. In this process, the gate oxide is thermally grown on a single crystal silicon substrate. Next, the gate oxide is exposed to an atmosphere containing nitrous oxide, nitric oxide, ammonia or other nitrogen source at a high temperature (about 900° C.) which results in nitrogen incorporation into the gate oxide. The resulting increased concentration of nitrogen containing species in the gate oxide prevents boron diffusion into the silicon substrate, hot electron degradation and improves the breakdown resistance of the gate oxide.

Unfortunately, hardening through nitrogen incorporation through the oxidation process has some drawbacks. Among these problems are that the high temperature treatment involved in gate oxide hardening by nitrogen diffusion cuts into the fabrication process' thermal budget. In addition, hardening with an ammonia anneal introduces electron traps into the dielectric. Furthermore, because the nitrogen tends to localize at the substrate-gate oxide interface, conventional hardening does reduce boron diffusion from the gate oxide to the silicon substrate, but fails to prevent boron diffusion into the gate oxide from a doped polysilicon gate electrode. This is important since the properties of the gate oxide may be adversely affected by creation of traps in oxide by dopants such as boron.

Nitrogen implantation processes in which nitrogen ions are implanted into polysilicon gate electrodes are described in S. Haddad, et al., *IEEE Electron Device Letter,* 8, 58–60, 1987; T. Kuroi, et al., *Tech. Dig. of the Int'l. Electron Devices Mtg. (IEDM)*, 325–328, 1993; S. Nakayama et al., 1996 *Symposium on VLSI Technology*, 228–229; A. Chou, et al., *International Reliability Physics Symposium*, 174–177, 1997, which are incorporated by reference herein. These processes produce a nitrogen concentration peak within the bulk polysilicon gate electrode. This effectively suppresses boron diffusion in the polysilicon and therefore cures some of the noted drawbacks in the nitrogen diffusion gate oxide hardening process. Unfortunately, the boron concentration drops off dramatically below the nitrogen concentration peak in the bulk polysilicon. The very low concentration of boron near the gate electrode-gate oxide interface results in formation of polysilicon depletion regions during device operation. Polysilicon depletion regions in the gate electrode act as non-conductive areas that effectively increase gate oxide thickness, thus degrading device performance.

Other nitridization methods have been investigated, including implantation of atomic nitrogen into the single crystal silicon substrate and growth of additional oxide on the substrate surface that incorporates the implanted nitrogen. C. T. Liu et al., *High Performance 0.2 $\mu$m CMOS with 25 Å gate oxide grown on nitrogen implanted Si substrates,* IEDM Technical Digest, 499–502 (1996). However, there are also several significant drawbacks to this approach. In particular, the crystal structure of the silicon substrate is damaged by the implant. In addition, the implant dose is limited by considerations of the effects on the channel behavior of devices with very high residual nitrogen concentrations. As a result, the creation of oxynitride bonds in the oxide layer according to this method is typically practically limited to less than one atomic percent.

It has been reported that surface regions of very thin gate oxide layers (about 4 nm) can be heavily nitridized, for example in the range of about 10 to 20 atomic percent. S. V. Hattangady et al., *Ultrathin nitrogen-profile engineered gate dielectric films,* IEEE International Electron Devices Meeting Technical Digest, 495–498, Dec. 8–11, 1996; D. T. Grider et al., *A 0.18 µm CMOS Process Using Nitrogen Profile-Engineered Gate Dielectrics,* IEEE 1997 Symposium on VLSI Technology Digest of Technical Papers, 47–48, Jun. 10–12, 1997. The technique described therein employs a remote plasma with self-bias. In this case, the equipment provides a plasma where ions will reach the wafer, however, the ion density at the wafer will be less than that of the source of the plasma. This technique relies upon the self-bias of the wafer, for example, by allowing the wafer to electrically "float", to control ion energy.

The work presented in these publications is also limited to very specific applications. The self-bias value depends upon the construction of a particular plasma reactor (processing chamber) and the chosen process parameters that might affect the nitridization reproducibility, including the nature of the wafer surface. The required configurations cannot be determined ab initio using this remote plasma with self-bias system.

Composite dielectric layers have also been proposed, for example, by U.S. Pat. Nos. 5,258,333 and 5,464,783. The '333 patent discloses a process of thermal nitridization of a silicon substrate in pure ammonia, followed by CVD deposition and optional thermal nitridization in $N_2$ of a high temperature oxide layer. The '783 patent involves the formation of an oxynitride layer on a silicon substrate, such as by a thermal anneal in an oxygen and nitrogen-containing atmosphere or by a CVD system using oxygen and nitrogen with silane, dichlorosilane, disilane, or $SiCi_4$ followed by a thermal oxidation step to form an oxide layer at the substrate-oxynitride interface. However, the processes described in these patents rely upon nitridization techniques which do not provide a high degree of control over the incorporation of nitrogen in an oxynitride layer, and are unable to achieve high levels of nitrogen incorporation (i.e., greater than about 10%) in the final oxynitride layer of the composite.

In some semiconductor integrated circuits, in particular those involving both digital and analog devices, the gate dielectric layer for the analog devices will need to be thicker than the gate dielectric layer for the digital devices. This is done, in general, to reduce leakage currents and to improve transconductance behavior in the analog devices. In such devices, hardening of the gate dielectric may be necessary in the thinner portions, particularly as device sizes decrease, while the thicker portions may have sufficient strength without hardening. Conventionally, these different dielectric layer thicknesses have been fabricated by masking off the portion of an oxide layer where this thicker dielectric is desired. The remaining unmasked oxide is then nitridized according to conventional processes, such as those described above. The mask is then removed and both portions of the dielectric are further oxidized. Since the nitridized region of the dielectric is oxidized more slowly than the pure oxide portion, it thickens at a slower rate, resulting in the formation of a variable thickness gate dielectric.

However, since the nitridization of the thinner region of the variable thickness dielectric is conducted according to the conventional procedures described above, it is also subject to the same drawbacks.

Accordingly, improved methods for producing dielectric layers having a variety of thicknesses on a single semiconductor wafer would be desirable, particularly in semiconductor integrated circuits involving both digital and analog devices scaled below 0.25 µm where thinner gate dielectric portions require nitridization hardening.

SUMMARY OF THE INVENTION

To achieve the foregoing, the present invention provides a method of fabricating gate dielectric layers having variable thicknesses and compositions over different regions of a semiconductor wafer. In a preferred embodiment of the present invention, a gate oxide layer is first grown over the various regions. Regions that are to have a relatively thicker, unhardened gate dielectric are masked and the wafer is nitridized by a technique which localizes nitrogen proximate to a top surface of the initial gate oxide layer, such as a remote plasma nitridization. After the nitridization process is completed, the mask is removed and the wafer is exposed to further oxidation. The regions where oxynitrides have been formed act as a barrier to the oxidation process. Consequently, different oxide thicknesses can be grown on the same wafer, thinner and hardened where nitridization has been performed, and thicker and not hardened in those regions that were masked during the nitridization.

In one aspect, the present invention provides a method of making a variable thickness gate dielectric. The method includes providing an initial gate oxide layer on a semiconductor wafer substrate, forming a mask over a portion of the initial gate oxide where a thicker dielectric is to be formed, and nitridizing the unmasked portion of the initial gate oxide by a technique which localizes nitrogen proximate to a top surface of the initial gate oxide layer. In a preferred embodiment, the nitridization technique involves a remote plasma, more preferably a remote plasma with active bias nitridization. The mask is then removed and the wafer is exposed to further oxidation. In this way, oxynitrides formed in the previously unmasked portion of the initial gate oxide layer act as a barrier to the oxidation process so that the further oxidation of the wafer produces a thicker dielectric layer in that portion of the initial gate oxide that was masked during the nitridization. Variable thickness gate dielectrics in accordance with the present invention may be particularly advantageous in semiconductor integrated circuits involving both digital and analog devices.

In another aspect, the invention provides a variable thickness gate dielectric made in accordance with a process described above.

These and other features and advantages of the present invention are described below with reference to the drawings.

DETAILED DESCRIPTION OF PREFERRED EMBODIMENTS

The method of fabricating variable thickness composite thin layer gate dielectrics of the present invention will now be described with reference a preferred embodiment. Important properties and characteristics of the preferred embodiment is illustrated in the structures in the text and in the accompanying drawings. While the invention will be described in conjunction with this preferred embodiment, it should be understood that the invention it is not intended to be limited to this preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a method of fabricating gate dielectric layers having variable thicknesses and compositions over different regions of a semiconductor wafer. In a preferred embodiment, a gate oxide layer is first grown over the various regions. Some regions (those to have a relatively thicker, on-hardened gate dielectric) are masked and the wafer is exposed to a remote low energy nitrogen plasma. The remote plasma may be used with a self-biased wafer, such as described in the with reference to the Hattangady et al. and Grider et al. articles noted above, or more preferably, by using an active bias on the wafer. After the nitridization process is completed, the mask is removed and the wafer is exposed to further oxidation.

In the previously unmasked regions, thin but highly concentrated oxynitrides have been formed. These act as a barrier to the oxidation process. Consequently, different oxide thicknesses can be grown on the same wafer, thinner and hardened where nitridization has been performed, and thicker and not hardened in those regions that were masked during the nitridization. This procedure avoids the many difficulties associated with conventional processes, noted above, including implanting high doses of nitrogen into the silicon substrate before oxidation. Variable thickness gate dielectrics in accordance with the present invention may be particularly advantageous in semiconductor integrated circuits involving both digital and analog devices.

Figure 1A:
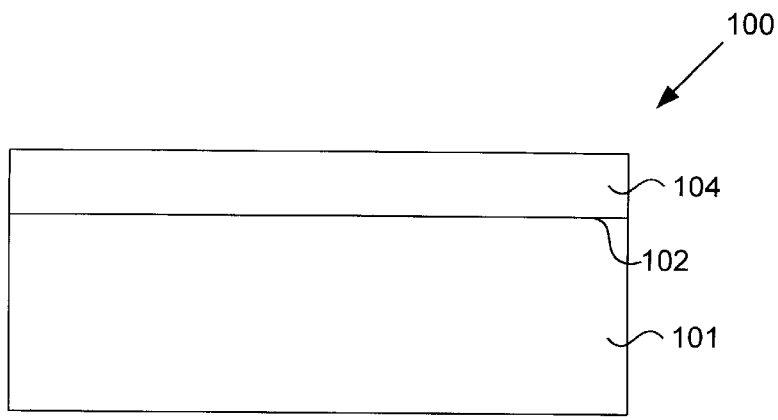
FIGS. 1A–C depict cross-sectional views of stages in the conventional fabrication of a semiconductor device.
Figure 1B:
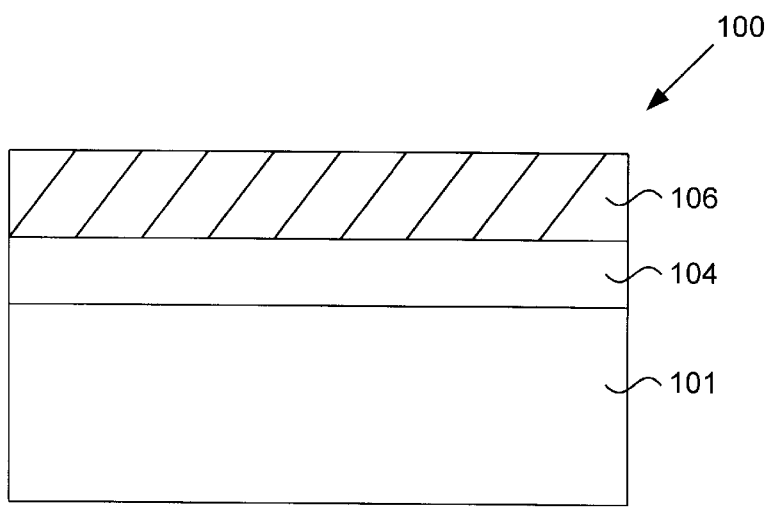
Figure 1C:
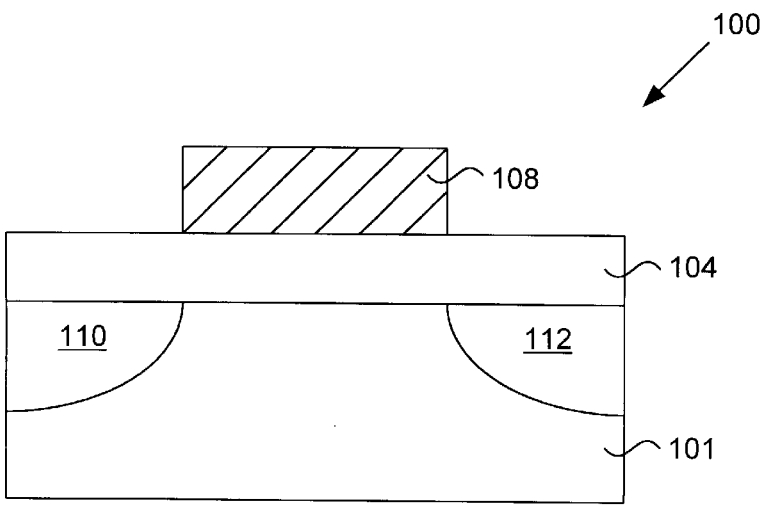
Figure 2A:
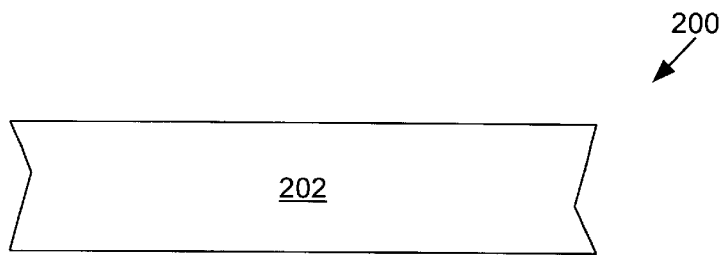
FIGS. 2A–F depict cross-sectional views of stages in the fabrication of a variable thickness gate dielectric according to a preferred embodiment of the present invention.
Figure 2B:
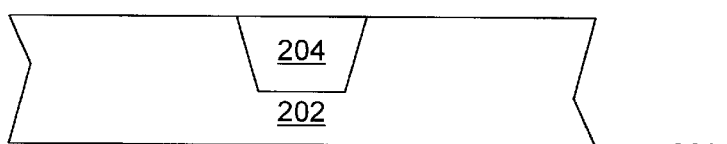

FIGS. 2A–F show stages in the fabrication of a variable thickness gate dielectric according to a preferred embodiment of the present invention. In FIG. 2A, a portion of a semiconductor wafer 200 is shown. The wafer 200 includes a substrate 202, preferably composed of single crystal silicon. In a first stage of this preferred embodiment, shown in FIG. 2B, an isolation oxide 204 is formed between portions of the substrate 202 surface which will be covered by different thicknesses of dielectric. Alternatively, an isolation trench may be used in place of the isolation oxide. Methods of forming isolation oxides and trenches are well known to those of skill in the art. It should be noted that the isolation oxide 204 formed according to this preferred embodiment of the present invention may not be required or desirable in all applications, and may be absent in other embodiments of the present invention.

Figure 2C:
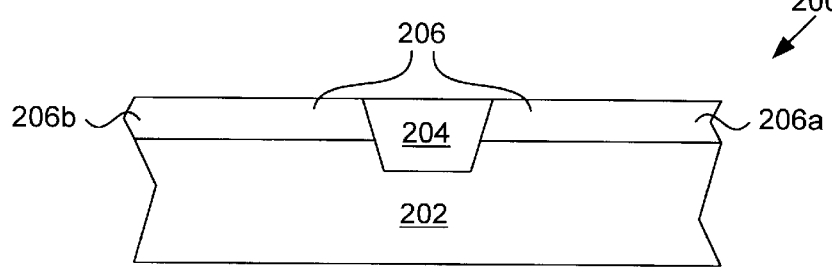

Then, as shown in FIG. 2C, a layer 206 of gate oxide, preferably silicon dioxide ($SiO_2$), is formed on the substrate 202 according to a method well known to those of skill in the art, such as by thermal treatment. In a preferred embodiment of the present invention, the layer may be very thin, for example, less than about 6.0 nm, preferably about 2.5 nm. As shown in FIG. 2C, the gate oxide layer has two regions, 206a and 206b.

Figure 2D:
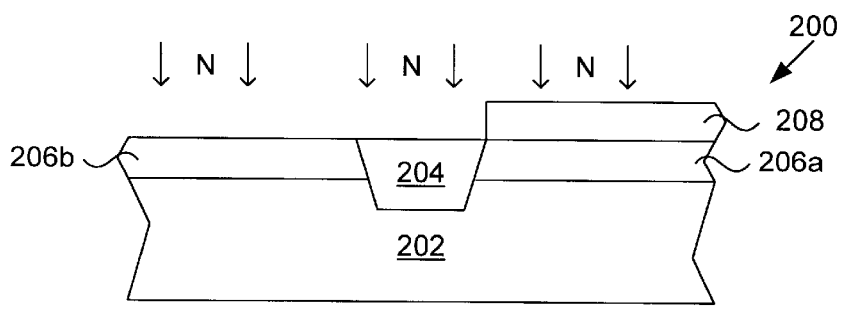

Next, as shown in FIG. 2D, the region 206a of the gate oxide 206 which is to have a relatively thicker, unhardened gate dielectric is masked with a photolithographic mask 208 according to procedures well known to those of skill in the art. The unmasked silicon dioxide of gate oxide region 206b may then be nitridized by treatment with a low energy remote nitrogen plasma.

According to a preferred embodiment of the present invention, the wafer 200 may be introduced into a plasma reactor (not shown), such as one that is normally used for plasma etching of polysilicon. Suitable reactors can generate a plasma density and energy appropriate for the creation of ionic species having energies sufficient to break silicon-silicon and silicon-oxygen bonds and penetrate the surface of the oxide layer 206b without substantially damaging its structure. A relatively low ion flux density, such as about $10^{10}/cm^2$ to $10^{13}/cm^2$, and low energy, such as less than about 35 eV, preferably between about 25 and 30 eV, and an accompanying neutral nitrogen atom high density flux about 3 to 6 orders of magnitude greater than the ion flux density, which can be separately controlled by the reactor, are preferred. The LAM 9400SE is an example of such a reactor. Molecular nitrogen may be introduced into the reactor to form the plasma containing nitrogen cations which have energies of less than about 35 eV, and which are sufficient to break silicon-silicon/silicon-oxide bonds so that active nitrogen (atomic and/or molecular) entities react at the surface of the oxide layer 206 and within several atomic layers into the layer producing a nitrogen-rich surface region in the oxide layer 206.

It should be noted that the low energy plasma nitridization process of the present invention preferably employs a remote plasma with active bias (remote plasma with active bias nitridization). That is, the ion energy is controlled by an active bias applied to the wafer 200, as opposed to a self-biased wafer. The application of an active bias gives the system independence from the plasma source through active control of ion energy for any system where ions in the plasma reach the wafer. This system also allows process parameters to be determined for different wafer surfaces by simulation before any nitridizations are performed.

For example, a LAM 9400SE reactor may be operated according to the following process parameters to achieve nitridization of a thin silicon dioxide layer, according to a preferred embodiment of the present invention: pressure of about 10 mtorr; $N_2$ flow rate of about 45 standard cubic centimeters per minute (sccm); TCP power of about 200 W; bias power of about 60 W; electrode temperature of about 60° C.; backside He pressure of about 8 torr; step time of about 10 minutes. Using these parameters, an ion flux of about 50 eV nitrogen species may be produced resulting in nitridization of the thin silicon oxide film to about 25 to 30 atomic percent.

Figure 2E:
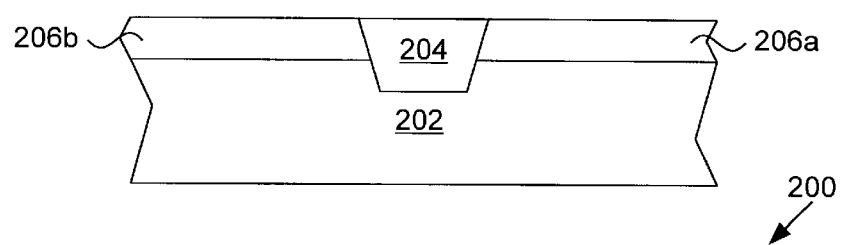

Following nitridization, the mask 208 is removed, as shown in FIG. 2E. At this stage, the previously masked gate dielectric region of the gate dielectric 206a remains about pure $SiO_2$. The previously unmasked region 206b is on oxynitride having a composition which may be represented by the formula $SiO_xN_y$ having a nitrogen concentration decreasing with depth. In a preferred embodiment, x may range from about 1 to 2 and y may range from about 0 to 1.

Figure 2F:
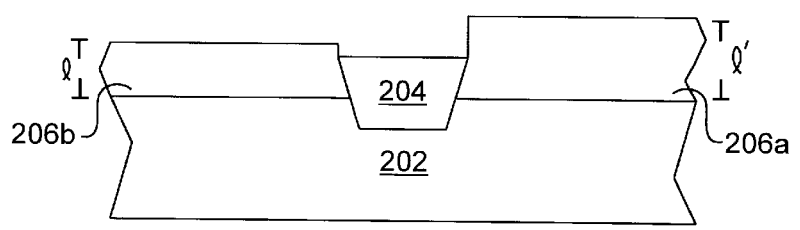

Then, the wafer is exposed to further oxidation according to methods well known in the art, such as thermal treatment. As shown in FIG. 2F, the oxynitrides which have been formed in the region 206b of the gate dielectric act as a barrier to the oxidation process. No such barrier exists in the un-nitridized region 206a of the gate dielectric. Consequently, different oxide thicknesses can be grown on the same wafer: Thinner and hardened where nitridization has been performed, and thicker and not hardened in those regions that were masked during the nitridization. As shown in FIG. 2F, the nitridized region 206a of the gate dielectric has a thickness designated 1. The un-nitridized region 206b has a thickness designated 1', which is greater than 1.

This procedure avoids the many difficulties associated with conventional processes, noted above, including the damage resulting from implanting high doses of nitrogen into the silicon substrate before oxidation. Variable thickness gate dielectrics in accordance with the present invention may be particularly advantageous in semiconductor integrated circuits involving both digital and analog devices.

EXAMPLE

The effectiveness of the barrier to oxidation created by the low energy plasma nitridization of gate oxide in accordance with the present invention, and its ability to generate variable thickness gate dielectrics, was verified experimentally. 4.5 nm of thermal oxide were first grown on the six wafers listed in Table I below. The wafers were given a half-wafer photoresist mask and then exposed to remote nitrogen plasmas with different levels of active biasing applied to the wafer. The average energy of the $N_2^+$ component of the plasma impinging on the oxide for a particular level of biasing is given in the first column of Table I. After exposure to the plasma, the photoresist masks were stripped and the wafers were exposed to further oxidation. The final oxide thicknesses measured for the unmasked portion of the wafer (exposed to plasma) are given in the third column while the final oxide thicknesses for the masked portion of the wafer (not exposed to plasma) are presented in the fourth column.

TABLE I

DUAL OXIDE CREATION BY MEANS OF SELECTIVE EXPOSURE TO REMOTE NITROGEN PLASMA WITH ACTIVE BIASING

| Remote Nitrogen Plasma with Active Biasing: $N_2^+$ Energy in eV | Oxide Exposure Time to Plasma (minutes) | Thickness of 4.5 nm Nitridized $SiO_x$ After Second Oxidation (nm) | Thickness of 4.5 nm $SiO_x$ After Second Oxidation (nm) |
| --- | --- | --- | --- |
| Wafer #1: 30 | 2 | 4.4 | 6.1 |
| Wafer #2: 30 | 5 | 4.4 | 6.1 |
| Wafer #3: 45 | 2 | 4.3 | 6.1 |
| Wafer #4: 45 | 5 | 4.2 | 6.1 |
| Wafer #5: 60 | 2 | 4.1 | 6.0 |
| Wafer #6: 60 | 5 | 4.3 | 6.0 |

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Moreover, the invention may be implemented with a variety of device sizes, both conventional and as device sizes continue to decrease. Accordingly, the present embodiments are to be considered as illustrative and not restrictive, and the invention is not to be limited to the details given herein, but may be modified within the scope and equivalents of the appended claims.

What is claimed is:

1. A method of making a variable thickness gate dielectric, comprising:

providing an initial gate oxide layer on a semiconductor wafer substrate;

forming a mask over a portion of the initial gate oxide layer where a thin dielectric is to be formed;

nitridizing the unmasked portion of said initial gate oxide by a technique which localizes nitrogen proximate to a top surface of the initial gate oxide layer;

removing said mask; and exposing said wafer to further oxidation;

whereby oxynitrides formed in the previously unmasked portion of the initial gate oxide layer act as a barrier to the oxidation process so that the further oxidation of the wafer produces a thicker dielectric layer in that portion of the initial gate oxide that was masked during the nitridization.

2. The method of claim 1, wherein said nitridization technique involves a remote plasma nitridization.

3. The method of claim 1, wherein said nitridization technique involves a remote plasma with active bias nitridization.

4. The method of claim 1, wherein said initial gate oxide layer has a thickness of less than about 6.0 nm.

5. The method of claim 4, wherein said initial gate oxide layer has a thickness of about 2.5 nm.

6. The method of claim 1, wherein said nitridized portion of said variable thickness gate dielectric comprises at least 10 atomic percent nitrogen.

7. The method of claim 6, wherein said nitridized portion comprises at least 20 atomic percent nitrogen.

8. The method of claim 1, wherein nitrogen is substantially distributed through said nitridized portion of said variable thickness gate dielectric in a decreasing concentration gradient from a top surface of said gate dielectric towards said silicon wafer substrate.

9. The method of claim 1, wherein said nitridized portion of said variable thickness gate dielectric comprises $SiO_xN_y$, having a nitrogen concentration decreasing with depth, where x ranges from about 1 to 2 and y ranges from about 0 to 1.

10. The method of claim 1, wherein said initial gate oxide layer provided on said wafer substrate is separated into two or more electrically isolated regions.

11. The method of claim 10, wherein said separation is provided by an isolation oxide.

12. The method of claim 10, wherein said separation is provided by an isolation trench.

13. A method of making a variable thickness gate dielectric, comprising:

providing an initial gate oxide layer on a semiconductor wafer substrate;

forming a mask over a portion of the initial gate oxide layer where a thin dielectric is to be formed;

nitridizing the unmasked portion of said initial gate oxide by exposing said wafer to a remote plasma with active bias nitridization;

removing said mask; and exposing said wafer to further oxidation;

whereby oxynitrides formed in the previously unmasked portion of the initial gate oxide layer act as a barrier to the oxidation process so that the further oxidation of the wafer produces a thicker dielectric layer in that portion of the initial gate oxide that was masked during the nitridization.

14. The method of claim 13, wherein said initial gate oxide layer has a thickness of less than about 6.0 nm.

15. The method of claim 14, wherein said initial gate oxide layer has a thickness of about 2.5 nm.

16. The method of claim 13, wherein said nitridized portion of said variable thickness gate dielectric comprises at least 10 atomic percent nitrogen.

17. The method of claim 16, wherein said nitridized portion comprises at least 20 atomic percent nitrogen.

18. The method of claim 13, wherein nitrogen is substantially distributed through said nitridized portion of said variable thickness gate dielectric in a decreasing concentration gradient from a top surface of said gate dielectric towards said silicon wafer substrate.

19. The method of claim 13, wherein said nitridized portion of said variable thickness gate dielectric comprises $SiO_xN_y$ having a nitrogen concentration decreasing with depth, where x ranges from about 1 to 2 and y ranges from about 0 to 1.

20. The method of claim 13, wherein said initial gate oxide layer provided on said wafer substrate is separated into two or more electrically isolated regions.

21. The method of claim 20, wherein said separation is provided by an isolation oxide.

22. The method of claim 20, wherein said separation is provided by an isolation trench.

* * * * *